United States Patent
Moore et al.

(10) Patent No.: US 8,338,315 B2
(45) Date of Patent: Dec. 25, 2012

(54) PROCESSES FOR CURING SILICON BASED LOW-K DIELECTRIC MATERIALS

(75) Inventors: Darren L. Moore, Somerville, MA (US); Carlo Waldfried, Middleton, MA (US); Ganesh Rajagopalan, Gilbert, AZ (US)

(73) Assignee: Axcelis Technologies, Inc., Beverly, MA (US)

( * ) Notice: Subject to any disclaimer, the term of this patent is extended or adjusted under 35 U.S.C. 154(b) by 484 days.

(21) Appl. No.: 12/037,222

(22) Filed: Feb. 26, 2008

(65) Prior Publication Data

US 2009/0215282 A1 Aug. 27, 2009

(51) Int. Cl.
*H01L 21/00* (2006.01)

(52) U.S. Cl. . 438/795; 438/789; 438/790; 257/E21.347; 257/E21.277

(58) Field of Classification Search ............... 438/795
See application file for complete search history.

(56) References Cited

U.S. PATENT DOCUMENTS

| 5,208,289 | A  | * | 5/1993  | Takarada et al. ............ 525/100 |
| 7,208,389 | B1 | * | 4/2007  | Tipton et al. ................ 438/409 |
| 2005/0245100 | A1 | * | 11/2005 | Wu et al. .................... 438/790 |
| 2006/0024976 | A1 | * | 2/2006  | Waldfried et al. ........... 438/778 |
| 2008/0044668 | A1 | * | 2/2008  | Dimitrakopoulos et al. . 428/446 |
| 2009/0233120 | A1 | * | 9/2009  | Maruyama et al. .......... 428/612 |

FOREIGN PATENT DOCUMENTS

JP    2001158688 A  *  6/2001

* cited by examiner

*Primary Examiner* — Thao Le
*Assistant Examiner* — Abdulfattah Mustapha
(74) *Attorney, Agent, or Firm* — Cantor Colburn LLP

(57) ABSTRACT

Processes for curing silicon based low k dielectric materials generally includes exposing the silicon based low k dielectric material to ultraviolet radiation in an inert atmosphere having an oxidant in an amount of about 10 to about 500 parts per million for a period of time and intensity effective to cure the silicon based low k dielectric material so to change a selected one of chemical, physical, mechanical, and electrical properties and combinations thereof relative to the silicon based low k dielectric material prior to the ultraviolet radiation exposure. Also disclosed herein are silicon base low k dielectric materials substantially free of sub-oxidized SiO species.

20 Claims, 6 Drawing Sheets

PROCESSES FOR CURING SILICON BASED LOW-K DIELECTRIC MATERIALS

BACKGROUND OF THE INVENTION

The present disclosure generally relates to dielectric films in semiconductor devices, and more particularly, to ultraviolet (UV) curing processes for low-k dielectric films. More particularly, embodiments of the disclosure relate to a process for improving the electrical, chemical, and mechanical properties of silicon based materials that are utilized as integrated circuit (IC) dielectrics.

New materials with low dielectric constants (known in the art as "low-k dielectrics") are being investigated for their potential use as insulators in semiconductor chip designs. A low dielectric constant material aids in enabling further reductions in the integrated circuit feature dimensions. In conventional IC processing, $SiO_2$ is used as a basis for the dielectric material resulting in a dielectric constant of about 3.9. Because of this, the term "low-k dielectric" generally refers to materials having a dielectric constant less than $SiO_2$, that is, a dielectric constant generally less than 3.9. More typically, for the advanced design rules, the dielectric constant is less than 3.0, and oftentimes less than 2.5.

The substance with the lowest dielectric constant is air (k=1.0). Therefore, porous dielectrics are very promising candidates since they have the potential to provide very low dielectric constants. The films are generally deposited or formed using a spin-on process or a chemical vapor deposition (CVD) process. Unfortunately, however, porous low-k dielectrics typically have the problem of insufficient mechanical strength and deposition temperatures of these materials can exceed allowable thermal budgets, which properties are needed to withstand the stresses of back end of line processing (BEOL). For example, after the formation of the low-k film, a cure process is generally performed to complete the formation of chemical bonds, outgas residual components, form pores, and/or reduce the dielectric constant in the film. This curing process is commonly performed in a batch mode using a furnace or in a single wafer mode using a hotplate. In either case, the conventional cure process undesirably subjects the wafer to an elevated temperature for an extended period of time (e.g., in excess of one hour to several hours and at a temperature in greater than about 300° C.). In addition to the problems related to the low-k dielectric's thermal and mechanical properties, the so-cured dielectric materials generally have relatively poor wet etching resistance, an area of concern where improvement is desired. Moreover, the time and equipment required to perform additional processes can undesirably add cost to a manufacturing process.

In addition to thermally curing the low k dielectric material, low k materials are oftentimes exposed to UV radiation in a controlled environment so as to remove porogens, and water; stabilize the k value of the low k dielectric material; and provide improved electrical and mechanical properties. Current processes of record uses the action of UV light in a controlled inert atmosphere such as nitrogen ($N_2$) or in a vacuum. The effects of the cure process on the low k material have recently been analyzed before and after UV exposure in the controlled inert atmosphere using FTIR. As will be discussed in greater detail below, it has been discovered that the inert atmosphere results in the formation of undesirable sub-oxidized species, i.e., silicon atoms with less than 4 Si—O bonds. The consequence of the sub-oxidized silicon groups (also referred to herein as sub-oxidized silicon species) with unbonded sites (i.e., coordination number is less than 4) includes, among others, a decrease in film electrical and chemical stability and a decrease in film integrity. These trends in mechanical properties are undesirable.

Accordingly, there remains a need for a curing process that provide silicon based low-k materials with improved electrical, mechanical and chemical properties, including improved elastic modulus and material hardness, without compromising or deteriorating its electrical properties.

BRIEF SUMMARY OF THE INVENTION

Embodiments of the disclosure meets that need by providing ultraviolet curing processes for advanced low-k materials that eliminate sub-oxidized Si—O content of silicon based low-k dielectric materials without compromising the desirable physical, electrical, mechanical or chemical properties of the low-k dielectric materials. In one embodiment, a process for curing a silicon based low k dielectric material comprises exposing the silicon based low k dielectric material to ultraviolet radiation in an inert atmosphere having an oxidant in an amount of about 10 to about 500 parts per million for a period of time and intensity effective to cure the silicon based low k dielectric material so as to change a selected one of chemical, physical, mechanical, and electrical properties and combinations thereof relative to the silicon based low k dielectric material prior to the ultraviolet radiation exposure.

In another embodiment, a process for reducing formation of sub-oxidized species in silicon based low k dielectric materials during an ultraviolet radiation curing process comprises providing an inert atmosphere; providing an oxidant in the inert atmosphere during ultraviolet radiation exposure of the silicon based low k dielectric material; and exposing the silicon based dielectric material to ultraviolet radiation wherein the amount of sub-oxidized SiO species formed are reduced relative to ultraviolet radiation exposure in the absence of the oxidant.

In still another embodiment, a silicon based low k dielectric material is prepared by a process comprising depositing the silicon based low k dielectric material onto a substrate; and exposing the silicon based low k dielectric material to ultraviolet radiation in an inert atmosphere having an oxidant in an amount of about 10 to about 500 parts per million for a period of time and intensity effective to cure the silicon based low k dielectric material so as to increase a selected one of chemical, physical, mechanical, and electrical properties and combinations thereof relative to the silicon based low k dielectric material prior to the ultraviolet radiation exposure.

These and other features and advantages of the embodiments of the invention will be more fully understood from the following detailed description of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the invention can be best understood when read in conjunction with the following figures, which are exemplary embodiments, in which.

DETAILED DESCRIPTION OF THE INVENTION

Figure 1:
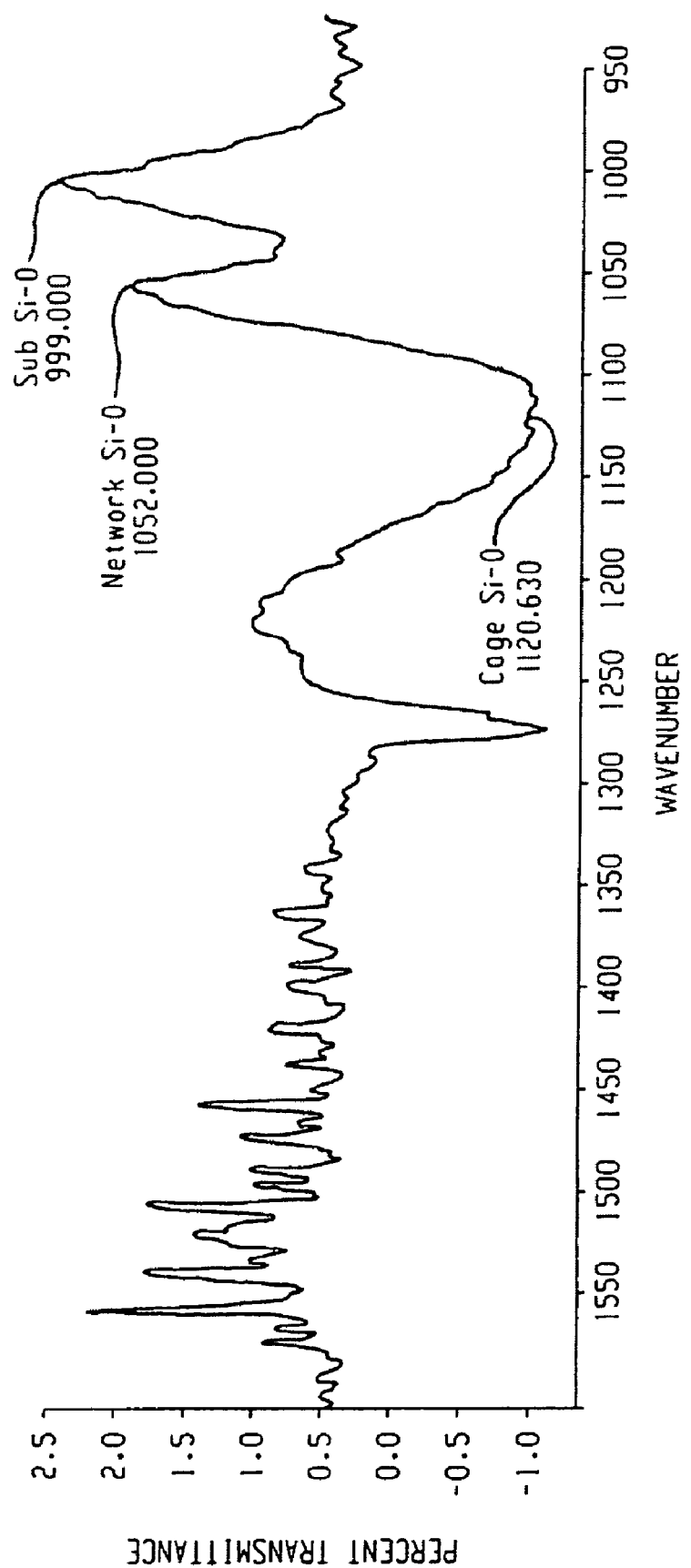
FIG. 1 is a chart illustrating the subtractive FTIR spectrum for a low-k film which was UV cured without the presence of oxygen or oxidizing gases, according to the prior art.

Disclosed herein are processes for UV curing silicon based low k dielectric materials. The process generally includes exposing the silicon based low k dielectric material in the presence of UV light and in the presence of a defined amount of oxidant. The so-cured low k dielectric material exhibits improved electrical, chemical and mechanical stability while maintaining its low dielectric constant properties. Although specific reference has been made to silicon based low k dielectric materials, it should be noted that the process can provide effective curing of other types of low k materials that are not necessarily silicon based. However, with specific regard to silicon based low k dielectric materials, it has been unexpectedly discovered that the presence of the oxidant during UV curing substantially prevents formation of sub-oxidized silicon species.

Suitable silicon based dielectric materials include, but are not limited to, organic materials, inorganic materials, or combinations thereof. For example, the silicon based dielectric material can be an organosilicate having a silica-like backbone with alkyl or aryl groups (to add hydrophobicity to the materials and create free volume) attached directly to the Si atoms in the network. More particularly, the dielectric material can include, but is not limited to, hydrogenated silicon oxy-carbide (SiCOH) dielectric materials, hydrogen silsesquioxane (HSQ) dielectric materials, methylsilsesquioxane (MSQ) dielectric materials, which can be produced by depositing a dielectric coating on a substrate using spin-on, chemical vapor deposition (CVD), plasma assisted CVD, evaporation, reactive evaporation, or self-assembled processes. The dielectric material can be either porous or dense. The porous dielectric materials can have porogen-generated, solvent-formed, or molecular engineered pores, which can be interconnected or closed, and which can be distributed random or ordered, such as vertical pores. It should be noted that CVD deposited silicon based dielectric materials are especially prone to formation of sub-oxidized species.

Exemplary materials include an advanced CVD low-k film such as, for example, Black Diamond® films available from Applied Materials® Inc. (Santa Clara, Calif.), Coral® low-k materials available from Novellus Systems Inc. (San Jose, Calif.), Orion® materials available from Trikon Technologies Inc. (Newport, South Wales, UK, and AURORA®, a hydrogenated silicon oxy-carbide (SiCOH) dielectric material available from ASM International N.V. (Bilthoven, the Netherlands). Such advanced low-k dielectric materials are produced using plasma enhanced chemical vapor deposition processes and have a k value of about 2.5 or less. Exemplary spin-on based dielectric materials for use in embodiments of the invention include: 1) FOx HSQ-based dielectric material and XLK porous HSQ-based dielectric material available from Dow Corning Corporation (Midland, Mich.), and 2) low-k porous dielectric MSQ-based materials, available from Chemat Technology, Inc. (Northridge, Calif.) and JSR Corporation (Tokyo, Japan).

As noted above, other low k dielectric materials may benefit from the process as disclosed herein include, without limitation, carbon doped oxide (CDO) dielectric materials, benzocyclobutene (BCB) dielectric materials, arylcyclobutene dielectric materials, polyphenylene based dielectric materials, and the like.

For some low-k materials, post-UV treating UV cured dielectric materials, using different wavelengths or temperatures, can further lower the dielectric constant, and provide equal or further improved elastic modulus and material hardness properties.

Advantageously, the UV curing processes as disclosed herein are particularly applicable to the deposition of coatings on electronic devices or electronic circuits where they can serve as interlevel dielectric layers, doped dielectric layers to produce transistor-like devices, pigment loaded binder systems containing silicon to produce capacitor and capacitor-like devices, multilayer devices, 3-D devices, silicon on insulator devices, super-lattice devices, and the like. However, the choice of substrates and devices to be coated by embodiments is limited only by the need for thermal and chemical stability of the substrate at the temperature and pressure used in embodiments of the invention. As such, the dielectric materials can be used on substrates such as plastics including, for example, polyimides, epoxies, polytetrafluoroethylene and copolymers thereof, polycarbonates, acrylics and polyesters, ceramics, leather, textiles, metals, semiconductors and the like. Moreover, the low-k dielectric material can be deposed on any one of a variety of substrates or on at least a portion of a substrate. Suitable substrates that can be used include, but are not limited to, semiconductor materials such as gallium arsenide, boron nitride silicon. compositions containing silicon such as crystalline silicon, polysilicon, amorphous silicon, epitaxial silicon, silicon dioxide, silicon carbide, silicon oxycarbide, silicon nitride, silicon carbonitride, organosilicate glasses, organofluorosilicate glasses, fluorsilicate glasses and other appropriate substrates or mixtures thereof. Substrates can further comprise a variety of layers to which the film is applied thereto such as, for example, antireflective coatings, photoresists, organic polymers, porous organic and inorganic materials, metals such as copper and aluminum, or diffusion barrier layers such as TiN, Ti(C)N, TaN, Ta(C)N, Ta, W, WN, TiSiN, TaSiN, SiCN, TiSiN, SiCN, TiSiN. SiN, TiSiCN, TaSiCN or W(C)N.

As used herein, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not limited to, silicon-based devices, gallium arsenide based devices, silicon carbide based devices, focal plane arrays, opto-electronic devices, photovoltaic cells, and optical devices.

It has been discovered that prior art UV curing processes applied to silicon based low k dielectrics can result in the silicon atoms with a formal oxidation state less than four, referred to herein as sub-oxidized Si—O species. FIG. 1 depicts a post-pre subtractive FTIR spectrum of a silicon based low k dielectric film UV cured according to the prior art, i.e., UV cured in a substantially inert atmosphere, e.g., an inert gas or vacuum. By substantially inert it is meant that the inert atmosphere contains less than 8 ppm $O_2$, which is generally a function of the gas purity of the gases used to form the inert atmosphere or of the integrity of the vacuum. Identified in the FIG. 1 are three bands associated with Si—O, one at 999 $cm^{-1}$ assigned to an asymmetric stretching mode of sub-oxidized Si—O, one at 1052 $cm^{-1}$ assigned to asymmetric stretching of network Si—O, and one at 1120 $cm^{-1}$ assigned to cage Si—O. Here, network Si—O refers to Si—O bonds that bridge between cage structures, and cage Si—O refers to Si—O bonds within a cage. A cage refers to a molecule of silicon, oxygen and a ligand, $Si_8O_{16}R_4$, where R can be methyl, for example. The post-pre subtractive spectra illustrates how the cure process results in increased network and sub-oxidized SiO formation, but reduced cage SiO.

It has been discovered that the presence of the sub-oxidized Si—O species reduces the electrical, chemical and mechanical stability of the silicon based low k dielectric materials by providing sites where other moieties, such as water, hydroxyl, or hydrogen, can bond to the sub-oxidized silicon, which can result in dangling bonds, thereby creating imperfections in the $SiO_2$ lattice (network and cage structure) and reducing the number of relatively more stable silicon-oxygen bonds. It has unexpectedly been discovered that the substantial elimination (or reduction relative to prior art UV processes) of sub-oxidized Si—O species to provide a dielectric material comprised of more fully or fully oxidized silicon enables the observed improvement in electrical, chemical and mechanical stability by "perfecting" the $SiO_2$ network and cage structures in the low-k dielectric material.

Figure 2:
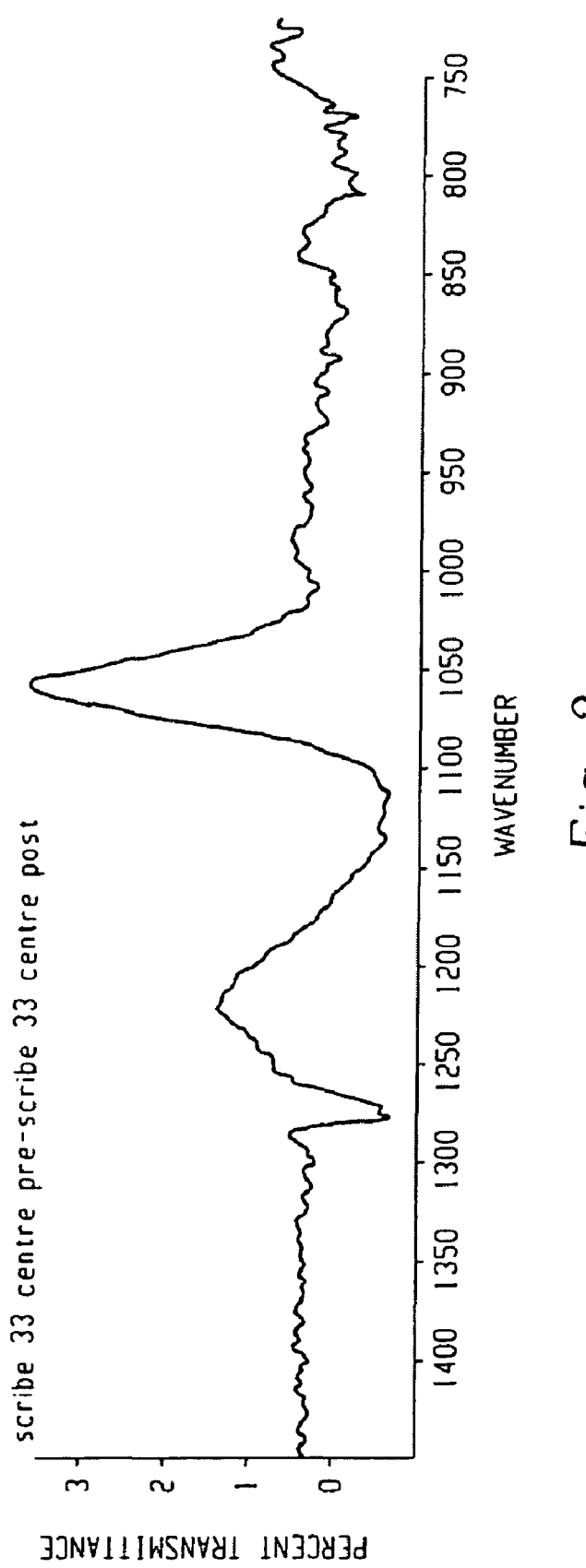
FIG. 2 is a chart illustrating the subtractive FTIR spectrum for a low-k film which was UV cured in the presence of 20 to 100 ppm $O_2$ in $N_2$.

Unexpectedly, it has been observed that if a silicon based dielectric material is UV cured in an inert environment e.g., $N_2$, in the presence of an oxidant in an amount from 10 to 500 ppm that the number of sub-oxidized Si—O species formed is significantly reduced and/or eliminated, as evidenced in FIG. 2, without degradation of the desirable electrical, chemical or mechanical properties of the low-k dielectric films. FIG. 2 represents a FTIR spectrum of a silicon based dielectric material UV cured in the presence of a process gas comprised of 50 ppm $O_2$ in $N_2$. Compared to the spectrum of FIG. 1, this spectrum does not exhibit a peak at 999 $cm^{-1}$, thereby indicating the absence of sub-oxidized Si—O species. While not wanting to be bound by theory, it is believed that the presence of oxygen in the amounts described chemically reacts with and oxidizes the sub-oxidized silicon species that may form during UV curing. At amounts higher than 500 ppm, it has been found that the concentration of $O_2$ may start to adversely effect the low k films. For example, increasing carbon loss through Si—$CH_3$ cleavage can occur resulting in a more $SiO_2$ like film and an increased dielectric value.

In one embodiment, a UV radiator tool is utilized in a UV curing process, wherein the tool is first purged with an inert gas, such as nitrogen, helium, or argon, and the like, or a combination of at least one of the foregoing, to allow the UV radiation to enter a process chamber with minimal spectral absorption. The silicon based low k dielectric material is positioned within the process chamber. Prior to UV exposure, an oxidative component is fed into the process chamber in a cumulative amount of between about 10 to about 500 ppm, specifically about 20 to about 100 ppm, more specifically about 20 to about 75 ppm, and all sub-ranges therebetween, based on the total gas content in the process chamber. In this regard, UV curing occurs in the presence of the process gas that comprises an oxidant.

In an alternative embodiment, the UV curing of the silicon based dielectric film can occur in a process comprised of multiple UV curing operations, wherein one or more of the UV curing operations occurs in an inert atmosphere or at conditions without the presence of oxygen or an oxidizing gas, and one or more of the UV curing operations occurs in the presence of a process gas, where the process gas comprises an oxidative gas as described above.

The oxidative gas, also referred to herein as the oxidant, can be provided to the process chamber by methods generally known to those in the art. For example, the oxidant can be introduced by incomplete evacuation after purging with a process gas that contains an oxidative gas, addition from a known volume, or by addition controlled by a mass flow controller, for example. Optionally, the oxidant is pulsed. Examples of oxidative gases include $O_2$, $O_3$, a nitrogen oxide, a sulfur oxide, water vapor, CO, $CO_2$ or NO, $C_xF_yO_z$, wherein x is an integer from 1 to 6, y is an integer from 1 to 14, and z is an integer from 1 to 4, and the like, or a combination of at least one of the foregoing.

UV generating bulbs with different spectral distributions can be selected depending on the application such as, for example, HL or HL-bulbs available from Axcelis Technologies (Beverly, Mass.). As such, the UV light source is not intended to be limited and can be microwave driven, arc discharge, dielectric barrier discharge, or electron impact generated. The wafer temperature can be controlled ranging from room temperature to 450° C. or higher, optionally by an infrared light source, an optical light source, a hot surface, or the light source itself. The process pressure can be less than, greater than, or equal to atmospheric pressure. The UV curing can occur for 50 to about 300 seconds. The UV curing can be accomplished using a UV wavelength of about 100 nm to about 400 nm at a UV power of about 0.1 to about 2000 $mW/cm^2$, specifically 1 to 1000 $mW/cm^2$, and all sub-ranges therebetween.

Examples of exemplary UV cure conditions for a 200 mm wafer are shown below.

| UV Power: | 0.1 mW-2000 $mW/cm^2$ |
|---|---|
| Wafer Temperature | room temp.-450° C. or higher |
| Process Pressure | <, >, or = to atmospheric |
| UV Cure Time: | <500 seconds |

The UV cured dielectric materials exhibit improved chemical stability and improved dimensional stability. By improved "chemical stability", we mean that the dielectric materials are more resistant to chemicals, such as wet cleaning solutions and chemical polishing solutions, and plasma damage during photoresist ashing and dry etching processes.

The following examples are presented for illustrative purposes only, and are not intended to limit the scope of the invention.

EXAMPLE 1

In this example, various process chamber atmospheres were examined during a UV curing process. In the examples, a silicon based low k dielectric material was coated onto a silicon wafer. The silicon based low k dielectric material was a SiCOH plasma enhanced CVD material deposited at 400° C. FTIR spectra were recorded in transmission mode with 4 cm-1 resolution on a Bio-Rad spectrometer. UV curing of the low-k coated silicon wafers was conducted in an Axcelis RPC320 FC film cure tool utilizing a UV source that provided a broad band distribution of radiation between about 100 and about 400 nm.

Figure 3:
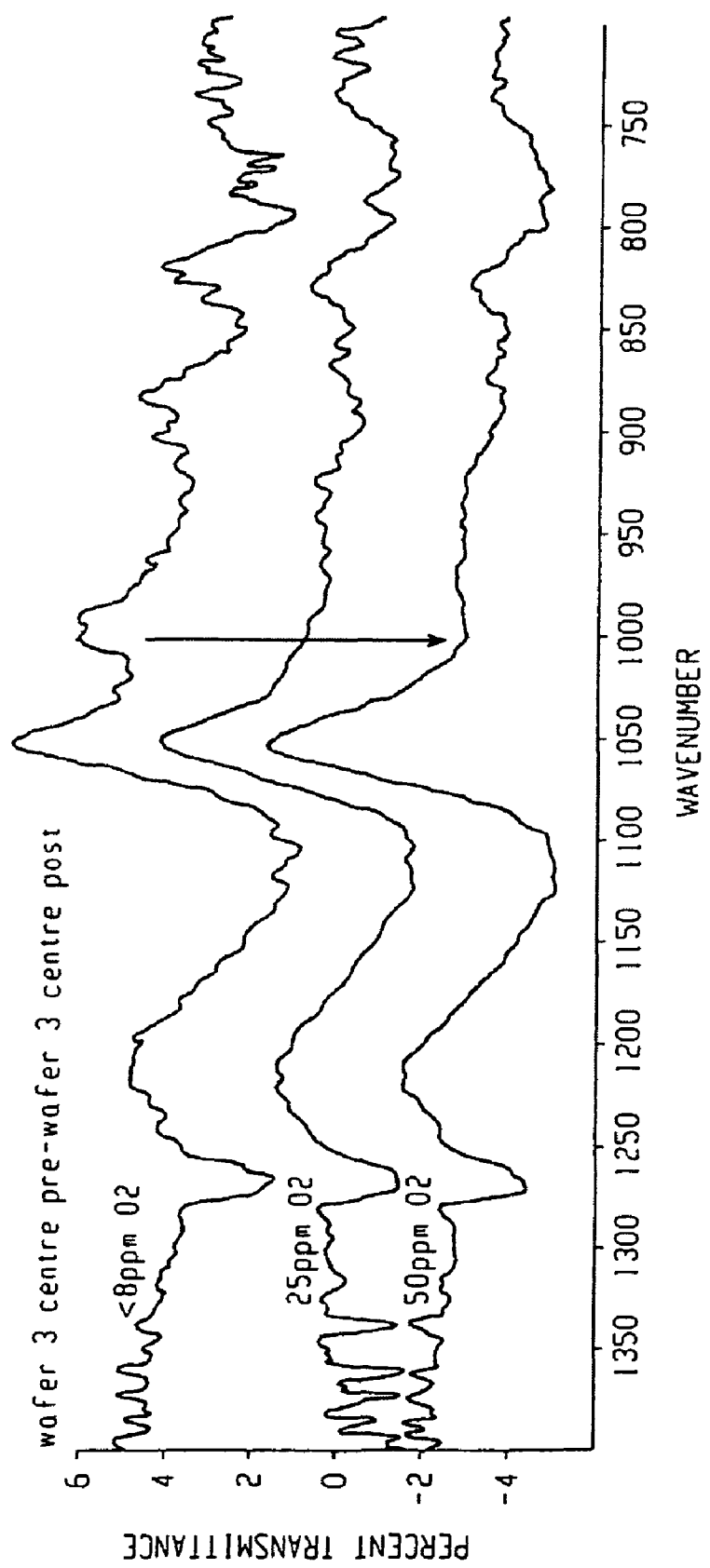
FIG. 3 is a chart illustrating subtractive FTIR spectra for low-k films that were UV cured in the presence of process gases containing respectively (A) less than 8 ppm $O_2$ (<8 ppm $O_2$), (B) 25 ppm $O_2$ (25 ppm $O_2$), or (C) 50 ppm $O_2$ (50 ppm $O_2$)

The process chamber atmospheres included an inert atmosphere of $N_2$ with less than 8 ppm $O_2$ (referred to herein as comparative example); an atmosphere with 25 ppm $O_2$, and an atmosphere of 50 ppm $O_2$. In this example, the silicon based low-k dielectric coated silicon wafer was placed on a heated platen in a UV curing apparatus and the apparatus purged with $N_2$ having less than 8 ppm $O_2$. For process chamber atmospheres having $O_2$ at 25 ppm and 50 ppm, small quantities of $O_2$ gas was fed into the process chamber along with the ambient $N_2$. The pressure in the apparatus was maintained at or slightly above atmospheric pressure. After the temperature of the platen was adjusted to 400° C. the silicon based low-k dielectric coated silicon wafer was irradiated with UV radiation for 240 s at while the platen was maintained at 400° C. After UV curing, the low-k coated silicon wafer was analyzed by FTIR. FIG. 3 illustrates the subtractive FTIR spectra for the various process chamber atmospheres. As shown, the comparative example includes a peak at 999 $cm^{-1}$ attributable to the presence of sub-oxidized Si—O species, which is not visible for process chamber atmospheres at 25 and 50 ppm $O_2$. The data demonstrates that the sub-oxidized Si—O species formed in the controlled atmospheres in accordance with the present disclosure are significantly reduced compared to that of the comparative example, i.e., an inert atmosphere with less than 8 ppm oxidant. In the case of 50 ppm, the spectrum does not include any peak at 999 $cm^{-1}$ that would attributable to sub-oxidized Si—O, indicating UV curing in 50 ppm $O_2$ substantially eliminated the sub-oxidized Si—O content of the low-k material.

Table 1 includes parameters measured as a function of UV curing in different concentrations of oxidant.

TABLE 1

| Property | Pre cure properties | No added Oxidant (supply gas <8 ppm $O_2$) | $O_2$ (25 ppm) | $O_2$ (50 ppm) |
|---|---|---|---|---|
| Shrinkage (%) | — | 3.8 | 5.3 | 6.0 |
| Modulus (Gpa) | 8.0 | 10.3 | 11.9 | 12.1 |
| Hardness (Gpa) | 1.1 | 1.5 | 1.7 | 1.7 |
| k value | 2.60 | 2.69 | 2.72 | 2.74 |

Advantageously, the addition of an oxidant within the ranges disclosed during UV curing of the low k silicon based dielectric material substantially prevented formation of sub-oxidized SiO grouping. FTIR analysis clearly demonstrated the decrease in formation of the sub-oxidized SiO grouping. Moreover, film analysis showed an improvement in film properties while maintaining k value. For example, modulus and hardness properties both increased relative to the comparative example. With regard to shrinkage, a more highly bonded and crosslinked SiO lattice leads to greater shrinkage since the lattice is much more ordered. However, one of the consequences of increasing concentrations of oxidant is the greater degree of carbon loss through removal of methyl radials, for example. This carbon loss can result in a small increased in k value.

EXAMPLE 2

In this example, cure efficiency was examined. NMR spectroscopy was used to monitor the extent of silicon lattice crosslinking for silicon species corresponding to the Q group since this particular group is the most highly linked providing a stronger and more robust film than the corresponding M, D, and T blocks. In other words, the presence of an increased amount of Q groups increases crosslinking density. The terms are generally used by those skilled in the art to refer to various siloxane building blocks as shown below.

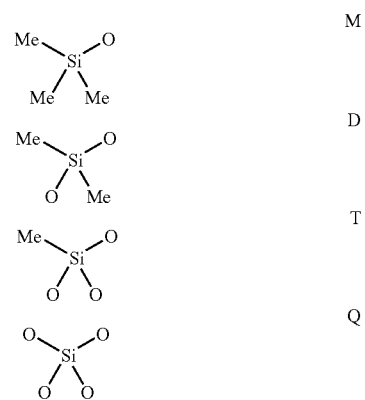

Figure 4:
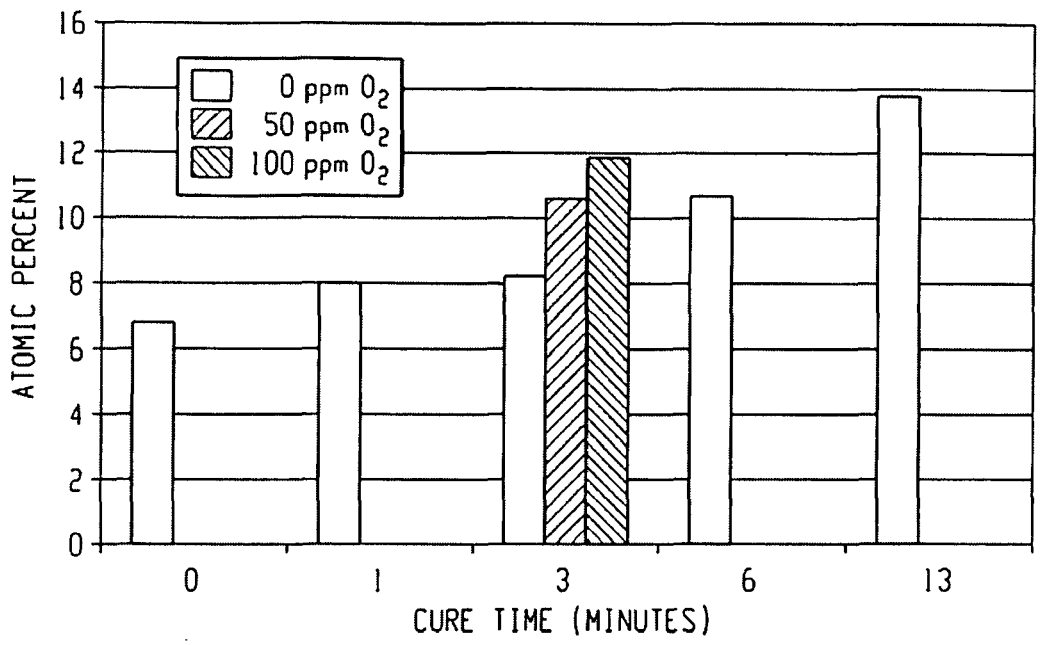
FIG. 4 is a chart illustrating UV cure efficiency for UV cure process having different levels of $O_2$ compared to the UV cure process without $O_2$, the chart illustrating the atomic percent of the Q silicone group as a function of time as measured by NMR spectroscopy.

The atomic percent of the Q group within a film was measured by NMR after UV curing of a silicon film. The silicon based low k dielectric material was a SiOCH silicon on glass material with post cure target k value of k=2.5. UV curing of the low-k coated silicon wafers was conducted in an Axcelis RPC320 FC film cure tool utilizing a UV source that provided a broad band distribution of radiation between about 100 and about 400 nm. Process conditions used a heated platen at 400° C., and process times of 0, 1, 3, 6 and 13 minutes. The process chamber atmospheres included an inert atmosphere of $N_2$ with less than 8 ppm $O_2$ (referred to herein as comparative example); an atmosphere with 50 ppm $O_2$ and an atmosphere of 100 ppm $O_2$. A baseline comparison was made by measuring changes in atomic percent (using NMR spectroscopy) as a function of time (e.g., 0, 1, 3, 6, 13 minutes) for a UV cure process without oxygen. This data was compared to the same UV cure process with the introduction of 50 ppm and 100 ppm of $O_2$ with a total cure time 3 minutes. As shown in FIG. 4, a UV cure in the presence of 50 and 100 ppm $O_2$ for a period of 3 minutes increased the atomic percentage of the Q group relative to the UV cure process without the added oxygen. Moreover, the introduction of 50 ppm or 100 ppm provided an equivalent or higher amount of Q block formation at less than half the time than the UV cure process without the addition of $O_2$. At 6 minutes, the atomic weight percent increase of the Q block was about 10.5% whereas after only 3 minutes with the addition of 50 ppm or 100 ppm $O_2$, the atomic percent increased to about 10.5 and about 11.8 percent, respectively. As such, significant gains in cure efficiency are observed upon the addition of oxygen during the UV cure process for this as well as other parameters.

Figure 5:
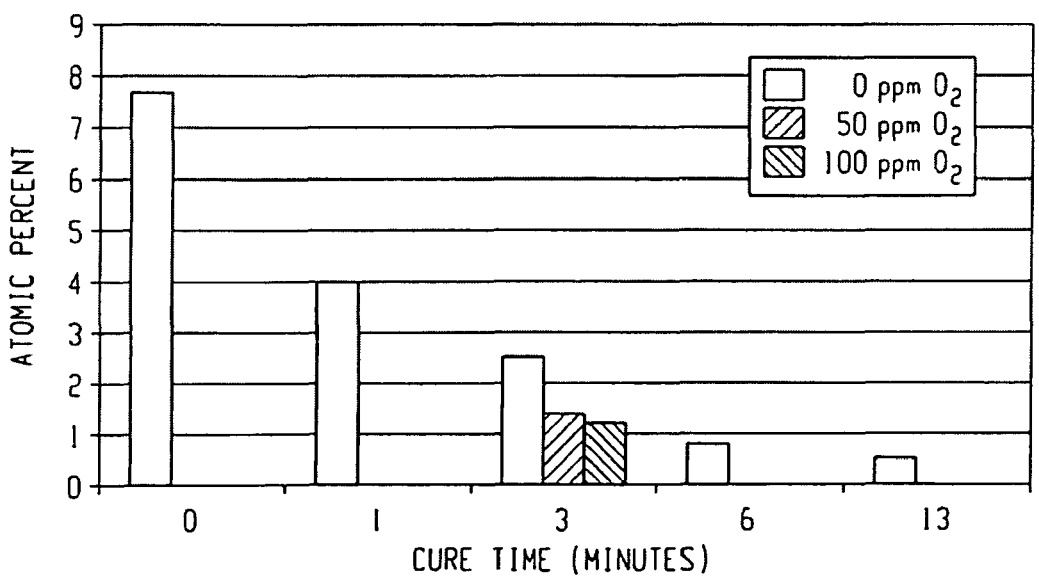
FIG. 5 is a chart illustrating UV cure efficiency for UV cure process having different levels of $O_2$ compared to the UV cure process without $O_2$, the chart illustrating the atomic percent of the M silicone group as a function of time as measured by NMR spectroscopy.

NMR was also used to monitor the extent of silicon lattice crosslinking for silicon species corresponding to the M group since this particular group is the least highly linked. Because of this, a higher proportion of M generally yields an inferior film. The UV cure process was in accordance with that provided in Example 2 above. FIG. 5 shows that the atomic percent of the M block decreased as the amount of $O_2$ was increased during the UV cure process. Moreover, the atomic percent of the M block for the UV cure proves with oxygen was almost equal to the amount after 6 minutes of UV cure without oxygen (1.1-1.2 atomic weight percent for UV cure with 50 and 100 ppm $O_2$ and a cure time of 3 minutes as compared to 0.8 atomic percent for the UV cure process without oxygen and a cure time of 6 minutes).

Figure 6:
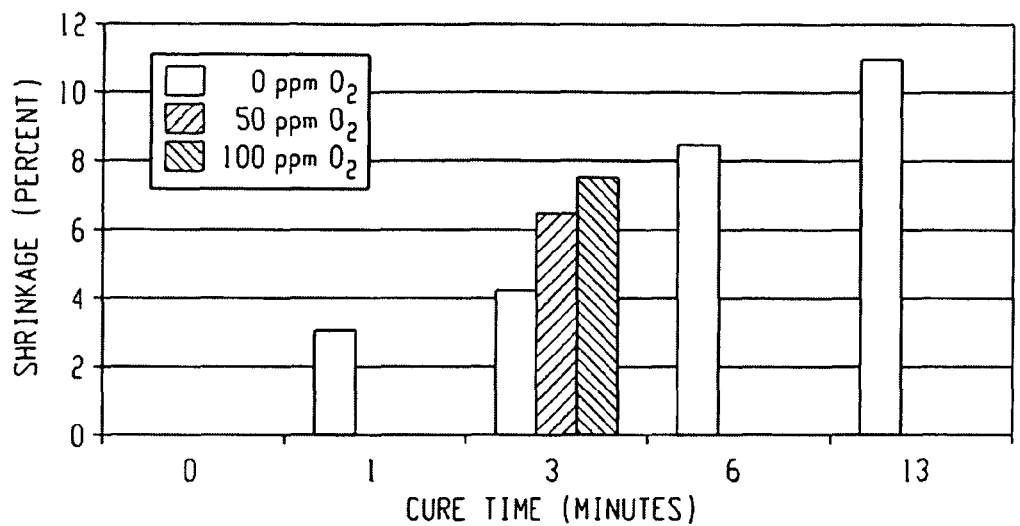
FIG. 6 is a chart illustrating change in film shrinkage for UV curing processes having different levels of $O_2$ compared to the UV cure process without O2, the chart illustrating percent shrinkage as a function of time.

FIG. 6 is a bar chart illustrating increased shrinkage (increased crosslinking density as a consequence of increasing Q groups) as a function of increased $O_2$ content during the UV cure process. A higher rate of shrinkage was observed with the controlled addition of $O_2$ during the UV cure process.

Figure 7:
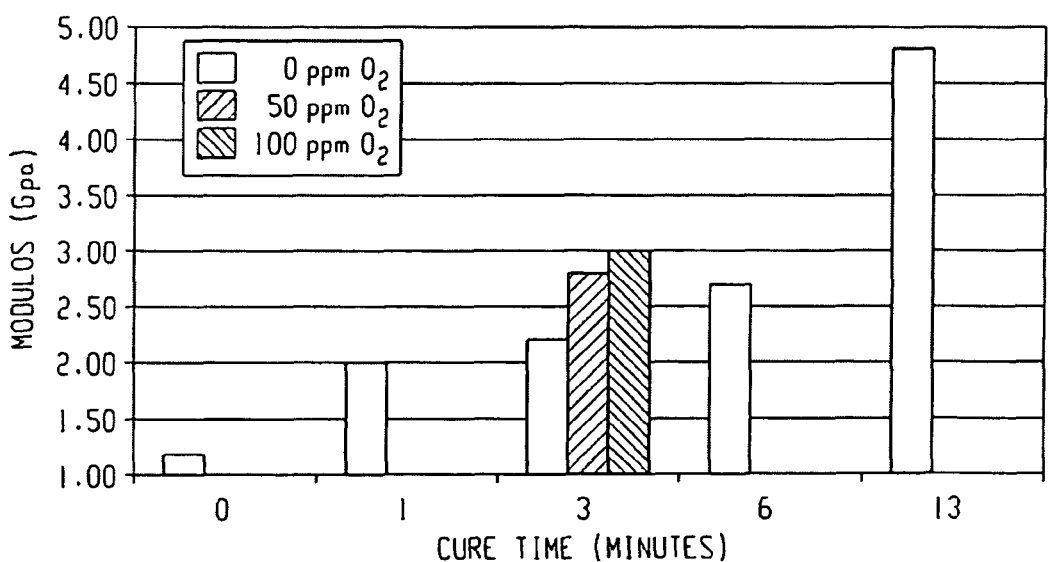
FIG. 7 is a chart illustrating change in film modulus properties for UV curing processes having different levels of $O_2$ compared to the UV cure process without $O_2$, the chart illustrating modulus as a function of time.

FIG. 7 is a bar chart illustrating increased film modulus as a function of increased $O_2$ content during the UV cure process. Remarkably, the film modulus after UV curing with oxygen for 3 minutes was greater than the UV cure process without oxygen after an exposure time of 6 minutes.

EXAMPLE 3

In this example, porogen removal efficiency was analyzed for a porogen containing film. The silicon based low k dielectric material was a porogen containing SiOCH plasma enhanced CVD material deposited at 400° C., with post cure target k value k=2.5. UV curing of the coated silicon wafers was conducted in an Axcelis RPC320 FC film cure tool utilizing a UV source that provided a broad band distribution of radiation between about 100 and about 400 nm. Process conditions used a heated platen at 400° C., and various process times. The process chamber atmospheres included an inert atmosphere of $N_2$ with less than 8 ppm $O_2$, an atmosphere with 50 ppm $O_2$ and an atmosphere of 100 ppm $O_2$. To obtain a comparative baseline, the porogen containing film was exposed to the UV cure process without added oxygen for cure times of 0, 1, 3, 6, and 13 minutes. These results were compared with cure processes using 50 ppm and 100 ppm oxygen added during a 3 minute curing process. The films were analyzed using FTIR at 3000 cm$^{-1}$ for the loss of CH groups, which are indicative of porogen removal.

Figure 8:
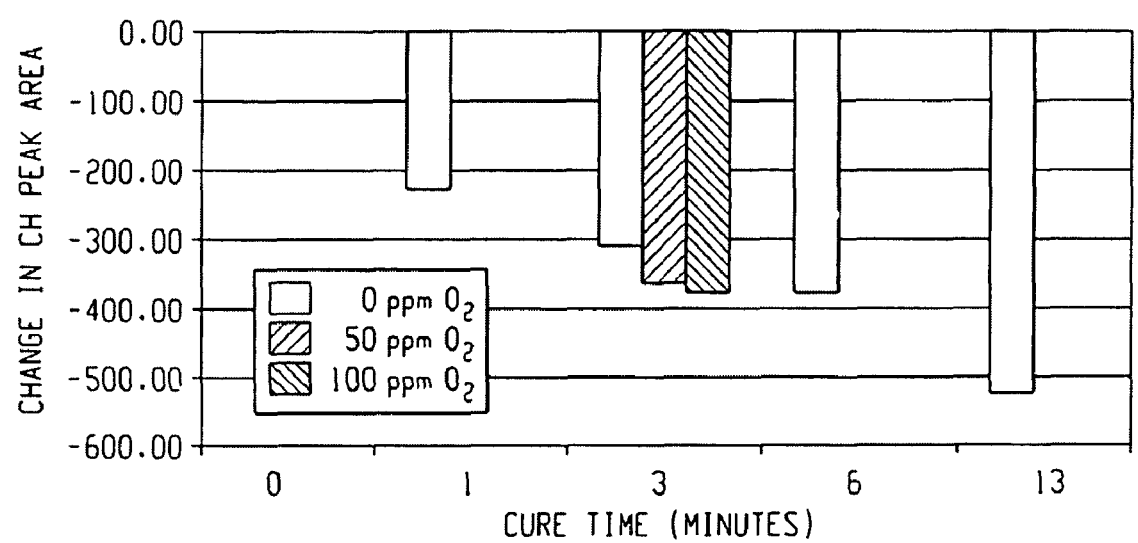
FIG. 8 is a chart illustrating change in porogen removal for UV curing processes having different levels of $O_2$ compared to the UV cure process without $O_2$, the chart illustrating loss of —CH porogen groups as a function of time Skilled artisans will appreciate that elements in the figures are illustrated for simplicity and clarity and have not necessarily been drawn to scale.

FIG. 8 is a bar chart illustrating increased loss of —CH groups as a function of increased $O_2$ content during the UV cure process. UV cure in the presence of oxygen increased porogen removal. Moreover, the porogen removal efficiency in the presence of oxygen was comparable to the UV cure process of 6 minutes without oxygen.

It will be understood that when an element is referred to as being "on"another element, it can be directly on the other element or intervening elements can be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the embodiments of the invention belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

While embodiments of the invention have been described with reference to exemplary embodiments, it will be understood by those skilled in the art that various changes can be made and equivalents can be substituted for elements thereof without departing from the scope of the embodiments of the invention. In addition, many modifications can be made to adapt a particular situation or material to the teachings of embodiments of the invention without departing from the essential scope thereof. Therefore, it is intended that the embodiments of the invention not be limited to the particular embodiment disclosed as the best mode contemplated for carrying out this invention, but that the embodiments of the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A process for curing silicon based low k dielectric materials, the process comprising:
    exposing the silicon based low k dielectric material to ultraviolet radiation in an inert atmosphere having an oxidant in an amount and for a period of time and intensity effective to cure the silicon based low k dielectric material so as to change a selected one of chemical, physical, mechanical, and electrical properties and combinations thereof relative to the silicon based low k dielectric material prior to the ultraviolet radiation exposure, wherein exposing the silicon based low k dielectric material to the ultraviolet radiation having the oxidant is effective to substantially prevent formation of sub-oxidized SiO species.

2. The process of claim 1, wherein exposing the silicon based low k dielectric material to the ultraviolet radiation increases porogen removal efficiency relative to the ultraviolet radiation exposure of the silicon based low k dielectric material without the oxidant.

3. The process of claim 1, wherein exposing the silicon based low k dielectric material to the ultraviolet radiation increases modulus relative to the ultraviolet radiation exposure of the silicon based low k dielectric material without the oxidant.

4. The process of claim 1, wherein exposing the silicon based low k dielectric material to the ultraviolet radiation increases shrinkage relative to the ultraviolet radiation exposure of the silicon based low k dielectric material without the oxidant.

5. The process of claim 1, wherein exposing the silicon based low k dielectric material to the ultraviolet radiation increases crosslinking density.

6. The process of claim 1, wherein the period of time decreases to obtain substantially the same or greater than an atomic percent of Q groups than the ultraviolet radiation exposure of the silicon based low k dielectric material without the oxidant.

7. The process of claim 1, wherein exposing the silicon based low k dielectric material to the ultraviolet radiation is in an amount and intensity effective to remove water.

8. The process of claim 1, wherein the inert atmosphere comprises the oxidant in an amount of 20 to 100 ppm.

9. The process of claim 1, wherein the silicon based low k dielectric is porous.

10. The process of claim 1, wherein the silicon based low k dielectric is selected from a group consisting of hydrogen silsesquioxane (HSQ) dielectric materials, methylsilsesquioxane (MSQ) dielectric materials, hydrogenated silicon oxycarbide (SiCOH) dielectric materials.

11. The process of claim 1, wherein the oxidant is pulsed.

12. The process of claim 1, wherein the oxidant is oxygen gas.

13. The process of claim 1, wherein the oxidant is a gas selected from the group consisting of O2, O3, a nitrogen oxide, water vapor, a sulfur oxide, CO, CO2, NO, CxFyOz, wherein x is an integer from 1 to 6, y is an integer from 1 to 14, and z is an integer from 1 to 4, and combinations thereof.

14. A process for reducing formation of sub-oxidized species in silicon based low k dielectric materials during an ultraviolet radiation curing process, the process comprising:
providing an inert atmosphere;
providing an oxidant in the inert atmosphere during ultraviolet radiation exposure of the silicon based low k dielectric material; and
exposing the silicon based dielectric material to ultraviolet radiation, wherein the amount of oxidant is effective to reduce sub-oxidized SiO species formed relative to ultraviolet radiation exposure in the absence of the oxidant.

15. The process of claim 14, wherein providing the oxidant comprises partially evacuating a process chamber to form the inert atmosphere therein.

16. The process of claim 14, wherein providing the oxidant comprises introducing the oxidant as a gas into the inert atmosphere.

17. The process of claim 16, wherein introducing the oxidant is pulsed.

18. The process of claim 16, wherein introducing the oxidant is continuous.

19. The process of claim 14, wherein the oxidant is a gas selected from the group consisting of O2, O3, a nitrogen oxide, water vapor, a sulfur oxide, CO, CO2, NO, CxFyOz, wherein x is an integer from 1 to 6, y is an integer from 1 to 14, and z is an integer from 1 to 4, and combinations thereof.

20. The process of claim 14, wherein the silicon based low k dielectric is selected from a group consisting of hydrogen silsesquioxane (HSQ) dielectric materials, methylsilsesquioxane (MSQ) dielectric materials, hydrogenated silicon oxycarbide (SiCOH) dielectric materials.

* * * * *